(12) United States Patent
Chen et al.

(10) Patent No.: US 9,972,571 B1
(45) Date of Patent: May 15, 2018

(54) LOGIC CELL STRUCTURE AND METHOD

(71) Applicant: Taiwan Semiconductor Manufacturing Co., Ltd., Hsinchu (TW)

(72) Inventors: Fang Chen, Hsinchu (TW); Jhon Jhy Liaw, Hsinchu County (TW); Min-Chang Liang, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/484,837

(22) Filed: Apr. 11, 2017

Related U.S. Application Data

(60) Provisional application No. 62/434,823, filed on Dec. 15, 2016.

(51) Int. Cl.
*H01L 27/00* (2006.01)
*H01L 23/528* (2006.01)
(Continued)

(52) U.S. Cl.
CPC .. *H01L 23/5283* (2013.01); *H01L 21/823821* (2013.01); *H01L 21/823828* (2013.01); *H01L 21/823871* (2013.01); *H01L 21/823878* (2013.01); *H01L 23/5226* (2013.01); *H01L 27/0207* (2013.01); *H01L 27/088* (2013.01); *H01L 27/0924* (2013.01); *H01L 27/1157* (2013.01); *H01L 29/0649* (2013.01); *H03K 19/20* (2013.01)

(58) Field of Classification Search
CPC ............ H01L 27/0207; H01L 27/1157; H01L 27/088; H01L 23/5226; H01L 21/823871
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |

(Continued)

FOREIGN PATENT DOCUMENTS

| | | |
|---|---|---|
| TW | 201234413 A | 8/2012 |
| TW | 201409665 A | 3/2014 |

(Continued)

*Primary Examiner* — Ngan Ngo
(74) *Attorney, Agent, or Firm* — Haynes and Boone, LLP

(57) ABSTRACT

The semiconductor structure includes a semiconductor substrate; field-effect devices disposed on the semiconductor substrate, wherein the field-effect devices include gates with elongated shape oriented in a first direction; a first metal layer disposed over the gates; a second metal layer disposed over the first metal layer; and a third metal layer disposed over the second metal layer. The first metal layer includes a plurality of first metal lines oriented in a second direction perpendicular to the first direction. The second metal layer includes a plurality of second metal lines oriented in the first direction. The third metal layer includes a plurality of third metal lines oriented in the second direction. The first metal lines have a first thickness, the second metal lines have a second thickness, the third metal lines have a third thickness, and the second thickness is less than the first thickness and the third thickness.

20 Claims, 10 Drawing Sheets

(51) Int. Cl.

| | | |
|---|---|---|
| *H01L 27/02* | (2006.01) | |
| *H01L 27/092* | (2006.01) | |
| *H01L 29/06* | (2006.01) | |
| *H01L 21/8238* | (2006.01) | |
| *H03K 19/20* | (2006.01) | |
| *H01L 23/522* | (2006.01) | |
| *H01L 27/1157* | (2017.01) | |
| *H01L 27/088* | (2006.01) | |

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,421,205 B2 | 4/2013 | Yang |
| 8,652,894 B2 | 2/2014 | Lin et al. |
| 8,661,389 B2 | 2/2014 | Chern et al. |
| 8,686,516 B2 | 4/2014 | Chen et al. |
| 8,698,205 B2 | 4/2014 | Tzeng et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,826,212 B2 | 9/2014 | Yeh et al. |
| 8,836,141 B2 | 9/2014 | Chi et al. |
| 8,860,148 B2 | 10/2014 | Hu et al. |
| 9,105,490 B2 | 8/2015 | Wang et al. |
| 9,251,888 B1* | 2/2016 | Liaw ..................... H01L 23/528 |
| 2005/0121793 A1* | 6/2005 | Liaw ....................... H01L 23/50 |
| | | 257/758 |
| 2014/0001574 A1 | 1/2014 | Chen et al. |
| 2014/0110755 A1 | 4/2014 | Colinge |
| 2014/0151812 A1 | 6/2014 | Liaw |
| 2014/0215420 A1 | 7/2014 | Lin et al. |
| 2014/0264924 A1 | 9/2014 | Yu et al. |
| 2014/0282289 A1 | 9/2014 | Hsu et al. |
| 2014/0325466 A1 | 10/2014 | Ke et al. |
| 2016/0300826 A1* | 10/2016 | Lee .................... H01L 27/0207 |
| 2017/0005100 A1* | 1/2017 | Cho ................... H01L 27/10897 |
| 2017/0170387 A1* | 6/2017 | Kim ....................... H01L 43/08 |
| 2017/0236885 A1* | 8/2017 | Koshihara ........... H01L 51/5265 |
| | | 257/89 |
| 2017/0256609 A1* | 9/2017 | Bhuwalka ........... H01L 29/0665 |
| 2017/0323889 A1* | 11/2017 | Song ................... H01L 27/092 |
| 2017/0352684 A1* | 12/2017 | Yang .................. H01L 27/1203 |

FOREIGN PATENT DOCUMENTS

| | | |
|---|---|---|
| TW | 201421272 A | 6/2014 |
| TW | 201421472 A | 6/2014 |
| TW | 201633508 A | 9/2016 |

\* cited by examiner

US 9,972,571 B1

LOGIC CELL STRUCTURE AND METHOD

PRIORITY DATA

This application claims priority to U.S. Provisional Patent Application Ser. No. 62/434,823 filed Dec. 15, 2016, the entire disclosure of which is hereby incorporated herein by reference.

BACKGROUND

A logic circuit includes various logic gates, such as inverters, NAND gates and NOR gates. The logic circuit plays an important role in various application including data processing, logic operation, high speed communication, and central processing unit. In deep sub-micron integrated circuit technology, the logic circuit progressed to smaller feature sizes for higher packing density. However, the existing structure of a logic circuit still has various aspects to be improved for its performance and further enhanced packing density. It is therefore desired to have a new structure and design of a logic circuit to address the above concern with increased packing density.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
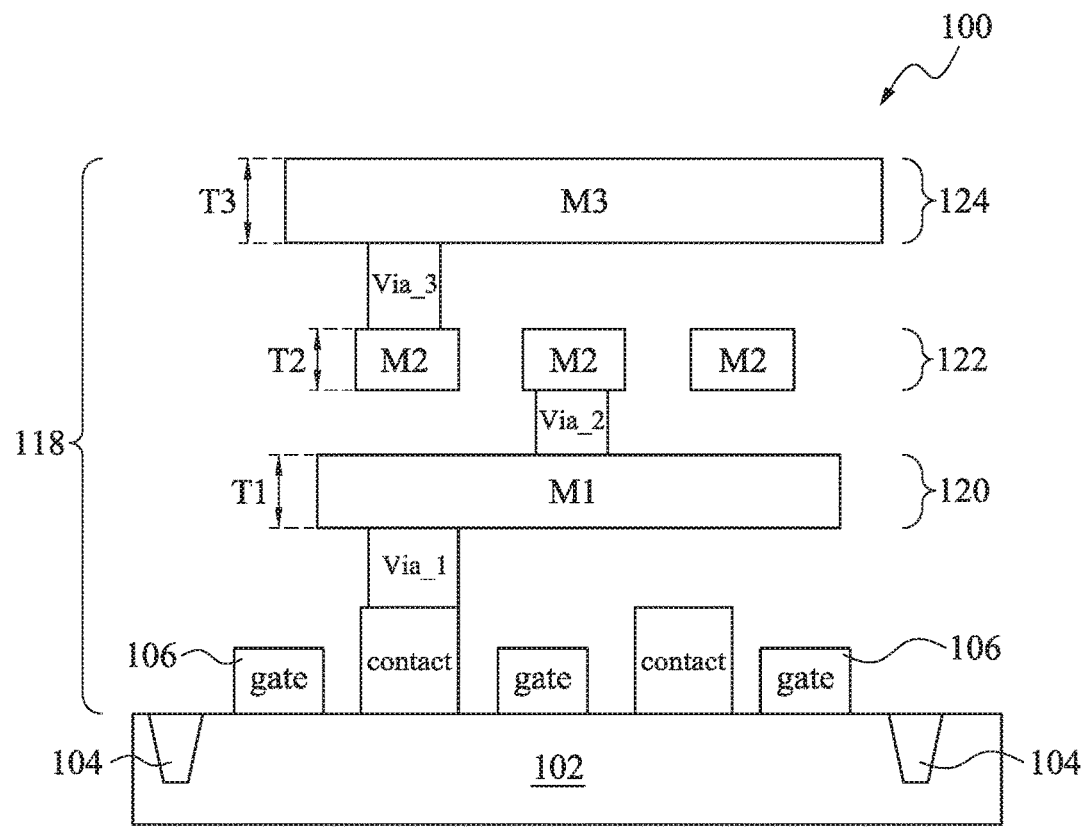
FIG. 1 is a sectional view of a semiconductor structure constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view of a semiconductor structure 100 constructed according to various aspects of the present disclosure in one embodiment. In some embodiments, the semiconductor structure 100 is formed on fin active regions and includes fin field-effect transistors (FinFETs). In some embodiments, the semiconductor structure 100 is formed on flat fin active regions and includes effect transistors (FETs). The semiconductor structure 100 includes a semiconductor substrate 102. The semiconductor substrate 102 includes silicon. Alternatively, the substrate includes germanium, silicon germanium or other proper semiconductor materials. The semiconductor substrate 102 may include other proper features and structures, such as isolation features 104.

The isolation feature 104 utilizes isolation technology, such as local oxidation of silicon (LOCOS) and/or shallow trench isolation (STI), to define and electrically isolate the various regions. The isolation feature 104 includes silicon oxide, silicon nitride, silicon oxynitride, other suitable dielectric materials, or combinations thereof. The isolation feature 104 is formed by any suitable process. As one example, forming STI features includes using a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as CMP. In some examples, the filled trench may have a multi-layer structure, such as a thermal oxide liner layer filled with silicon nitride or silicon oxide.

The semiconductor substrate 102 further includes various doped features, such as n-type doped wells, p-type doped wells, source and drain features, other doped features, or a combination thereof configured to form various devices or components of the devices, such as source and drain features of a field-effect transistor. In one embodiment, the semiconductor substrate 102 employs a layer of semiconductor material formed over an insulating layer on a supporting bulk wafer for isolation. The technology and structure are referred to as semiconductor on isolation (SOI). The SOI structure can be formed by different techniques including separation by implanted oxygen (SIMOX), bonding and etching back (BESOI), and zone melting and recrystallization (ZMR).

Figure 2:
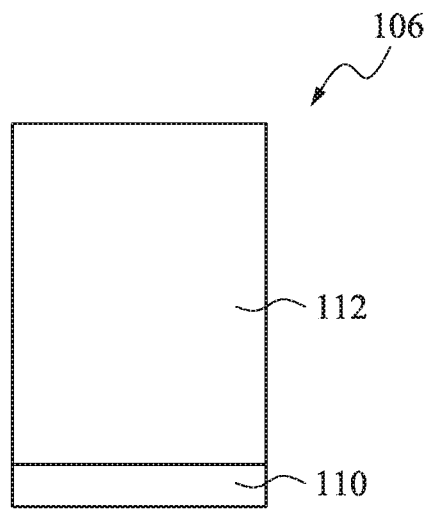
FIG. 2 is a sectional view of a transistor gate in the semiconductor structure of FIG. 1, in accordance with some embodiments.
Figure 3:
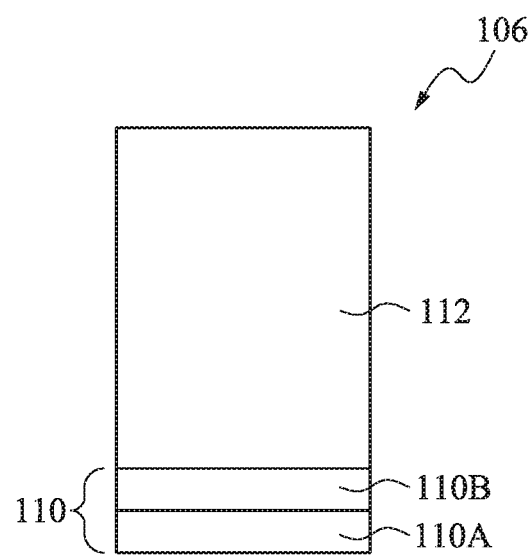
FIG. 3 is a sectional view of a transistor gate in the semiconductor structure of FIG. 1, in accordance with some embodiments.

The semiconductor structure 100 further includes various gates 106 having elongated shape oriented in X direction. In the present embodiment, X and Y directions are orthogonal and define a top surface 108 of the semiconductor substrate 102. A gate 106 includes a gate dielectric layer 110 (such as silicon oxide) and a gate electrode 112 (such as doped polysilicon) disposed on the gate dielectric layer, as illustrated in FIG. 2 as a sectional view. In another embodiment, the gate 106 alternatively or additionally includes other proper materials for circuit performance and manufacturing integration. For example, the gate dielectric layer 110 includes high k dielectric material layer, such as metal oxide, metal nitride or metal oxynitride. In various examples, the high k dielectric material layer includes metal oxide: ZrO2, Al2O3, and HfO2, formed by a suitable method, such as metal organic chemical vapor deposition (MOCVD), physical vapor deposition (PVD), atomic layer deposition (ALD), or molecular beam epitaxy (MBE). The gate dielectric layer may further include an interfacial layer 110A interposed between the semiconductor substrate 102 and the high k dielectric material 110B, as illustrated in FIG. 3. In some embodiments, the interfacial layer includes silicon oxide formed by ALD, thermal oxidation or ultraviolet-Ozone Oxidation.

The gate electrode 112 includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). multiple conductive films designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examplse, the work function metal layer for pFET includes titanium nitride, tantalum nitride or a combination thereof.

In some embodiments, the field-effect transistors are configured and connected to form various logic gates, such as an inverter, an NAND gate and a NOR gate. Those logic gates are further connected to form a logic circuit. It is noted that various logic gates each may include multiple field-effect transistors and each FET includes a source, a drain and a gate 106. The gate 106 should not be confused with a logic gate. For clarification, sometime, the gate 106 is also referred to as transistor gate.

The gates are formed by various deposition techniques and a proper procedure, such as gate-last process, wherein a dummy gate is first formed, and then is replaced by a metal gate after the formation the source and drain features. Alternatively, the gate is formed by high-k-last a process, wherein the both gate dielectric material layer and the gate electrode are replaced by high k dielectric material and metal, respectively, after the formation of the source and drain features. One exemplary gate structure 106 and the method making the same are further described later in accordance with some embodiments.

Referring back to FIG. 1, the semiconductor structure 100 also includes multilayer interconnection (MLI) structure 118 designed and configured to couple various field-effect transistors and other devices to form a logic circuit having various logic gates, such as inverters, NAND gates, NOR gates, other logic gates (such as AND gates, and OR gates), or a combination thereof.

The MLI structure 118 includes a first metal layer 120, a second metal layer 122 over the first metal layer 120 and a third metal layer 124 over the second metal layer 122. Each metal layer includes a plurality of metal lines, such as first metal lines ("M1") in the first metal layer 120, second metal lines ("M2") in the second metal layer 122, and third metal lines ("M3") in the third metal layer 124. The MLI structure 118 may include more metal layers, such as a fourth metal layer, fifth metal layer, and so on. In the present embodiments, the metal lines in each layer are oriented in a same direction. Specifically, the first metal lines are oriented in the Y direction, the second metal lines are oriented in the X direction and the third metal lines are oriented in the X direction. The metal lines in different metal layers are connected through vertical conductive features (also referred to as via features), such as "via1", "via2" and "via3". The metal lines are further coupled to the semiconductor substrate 102 (such as source and drain features) through vertical conductive features (also referred to as "contact").

The metal lines in different layers have different dimensional parameters. Particularly, the first metal lines have a first thickness T1, the second metal lines have a second thickness T2, and the third metal lines have a third thickness T3. The second thickness T2 is less than the first thickness T1 and the third thickness T3. In some examples, the first thickness T1 and the third thickness T3 are substantially equal to each other, such as the difference (T1-T3) is less than 15% of T1 or T3.

Figure 4:
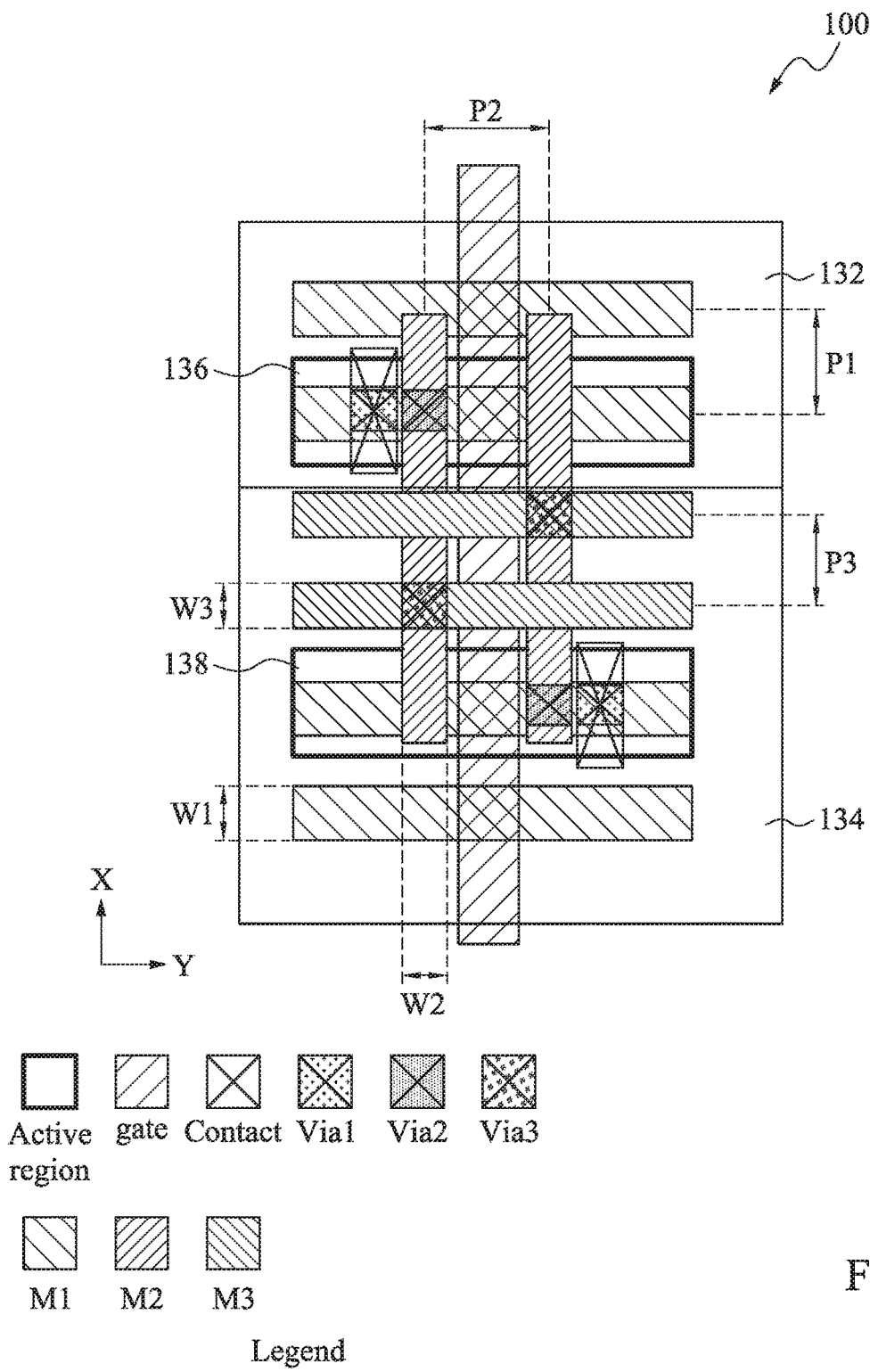
FIG. 4 is a top view of a semiconductor structure, in accordance with some embodiments.

In some embodiments, the metal lines in different layers have different pitches, such as illustrated in FIG. 4 as a top view of the semiconductor structure 100 in portion constructed according to some embodiments. It is noted that the semiconductor structure in FIG. 4 is only for illustration. The semiconductor structure 100 in FIG. 4 may be a logic gate or a portion of a logic gate. The figure legends are shown in FIG. 4, which are also applicable to FIGS. 5-10. The semiconductor structure 100 includes an n-type doped well (N-well) 132 and a p-type doped well (P-well) 134. Active regions 136 and 138 are defined by and surrounded by the isolation features (such as STI features). Various devices including a pFET and an nFET are formed within the N-well 132 and the P-well 134, respectively. Particularly, a gate, first metal lines, second metal lines, third metal lines and various via features and contacts are formed thereon and configured to form a functional circuit. The pitch of metal lines is defined as a distance from an edge of a metal line to the corresponding edge of an adjacent metal line in a same metal layer. When the pitch of metal lines is reduced, the pattern density of the corresponding metal lines is increased. In the present embodiment, the first metal lines have a first pitch P1, the second metal lines have a second pitch P2, and the third metal lines have a third pitch P3. The second pitch P2 is less than the first pitch P1 and the third pitch P3. In some examples, the first pitch P1 and the third pitch P3 are substantially equal to each other, such as the difference (P1-P3) is less than 15% of P1 or P3.

In some embodiments, the metal lines in different layers have different widths. The width of metal lines is defined as a dimension of the metal lines measured along the direction perpendicular to the orientation of the corresponding metal lines. As illustrated in FIG. 4, the first metal lines have a first width W1, the second metal lines have a second width W2, and the third metal lines have a third width W3. The second width W2 is less than the first width W1 and the third width W3. In some examples, the first width W1 and the third width W3 are substantially equal to each other, such as the difference (W1-W3) is less than 15% of W1 or W3.

In some embodiments, one, two or all three of the above dimensional parameters (thickness, pitch and width) in the three metal layers are different in accordance with above rules. For example when all three parameters are different, the second thickness T2 is less than the first thickness T1 and the third thickness T3; the second pitch P2 is less than the first pitch P1 and the third pitch P3; and the second width W2 is less than the first width W1 and the third width W3.

By reducing the dimensions (T2 and W2) of the second metal lines, the second pitch P2 is reduced. Accordingly, thus designed and formed logic circuits have increased packing density and reduced logic gate dimensions. This structure and design methodology will be further described in accordance with various examples below.

Figure 5:
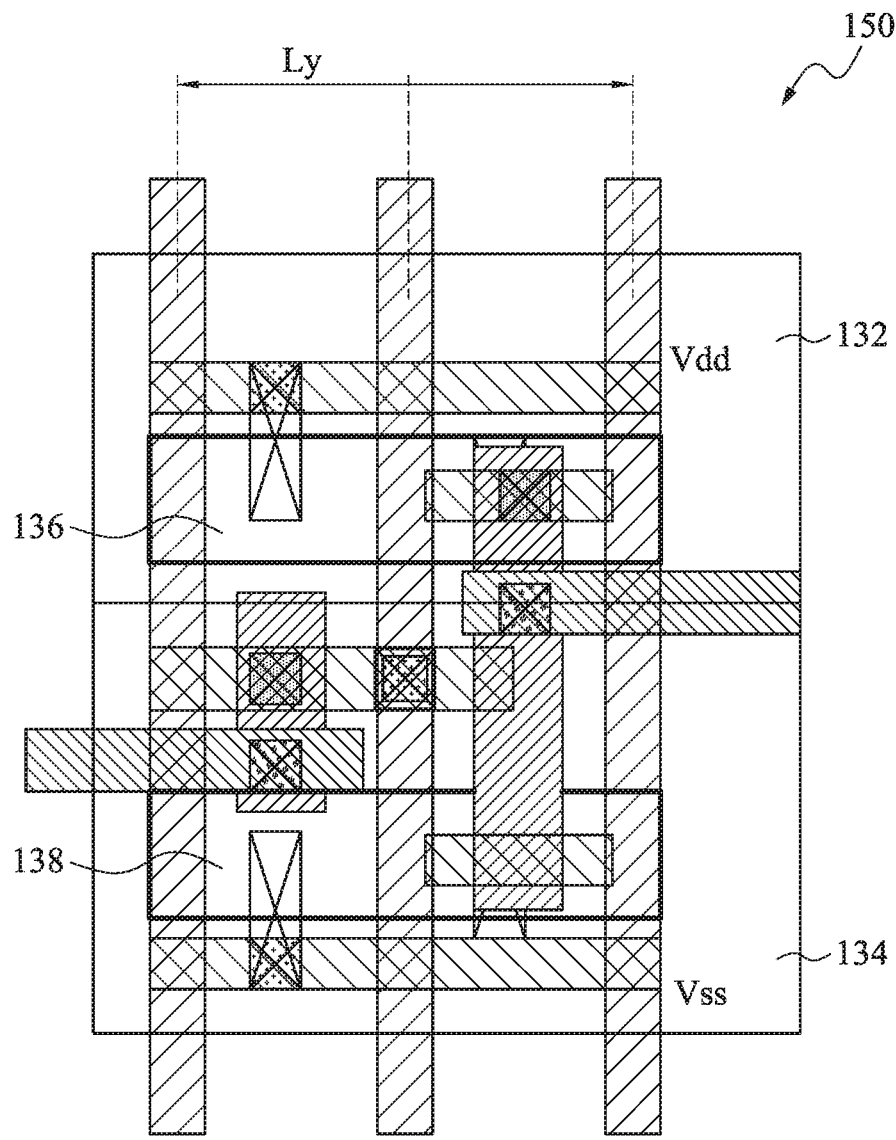
FIG. 5 is a top view of a semiconductor structure having an inverter, in accordance with some embodiments.

FIG. 5 is a top view of a semiconductor structure 150 constructed in accordance with some embodiments. The semiconductor structure 150 includes an inverter and is one example of the semiconductor structure 100, wherein the second metal lines M2 have one or more dimensional parameters (such as thickness, pitch, and width) less than the corresponding ones of the first and third metal lines, as described above.

The semiconductor structure 150 includes an n-type doped well (N-well) 132 and a p-type doped well (P-well) 134. A pFET and an nFET are formed within the N-well 132 and the P-well 134, respectively. Active regions 136 and 138 are defined by and surrounded by the isolation features (such as STI features). In the semiconductor structure 150, the pFET and the nFET are coupled together to form a functional inverter. In the present example, the nFET and pFET are configured with corresponding drains connected together (referred to as common drain) and corresponding gates connected together (referred to as common gate). Furthermore, the source of the pFET is connected to power line ("Vdd") and the source of the nFET is connected to the ground line ("Vss"). The common gate and the common drain of the inverter serves as input and output, respectively.

The gates have a gate pitch P4 defined similarly as those associated with the metal lines. In the present embodiment, the pitch P2 of the second metal lines and the gate pitch P4 are configured with a ratio P2:P4 being about 3:2, with a variation less than 20%. In other words, the ratio P2/P4=3/2 (1±20%). In this design, the inverter in the semiconductor structure 150 is well packed such that the inverter spans along the Y direction with a dimension Ly of about 2 gate pitch as 2*P4.

Figure 6:
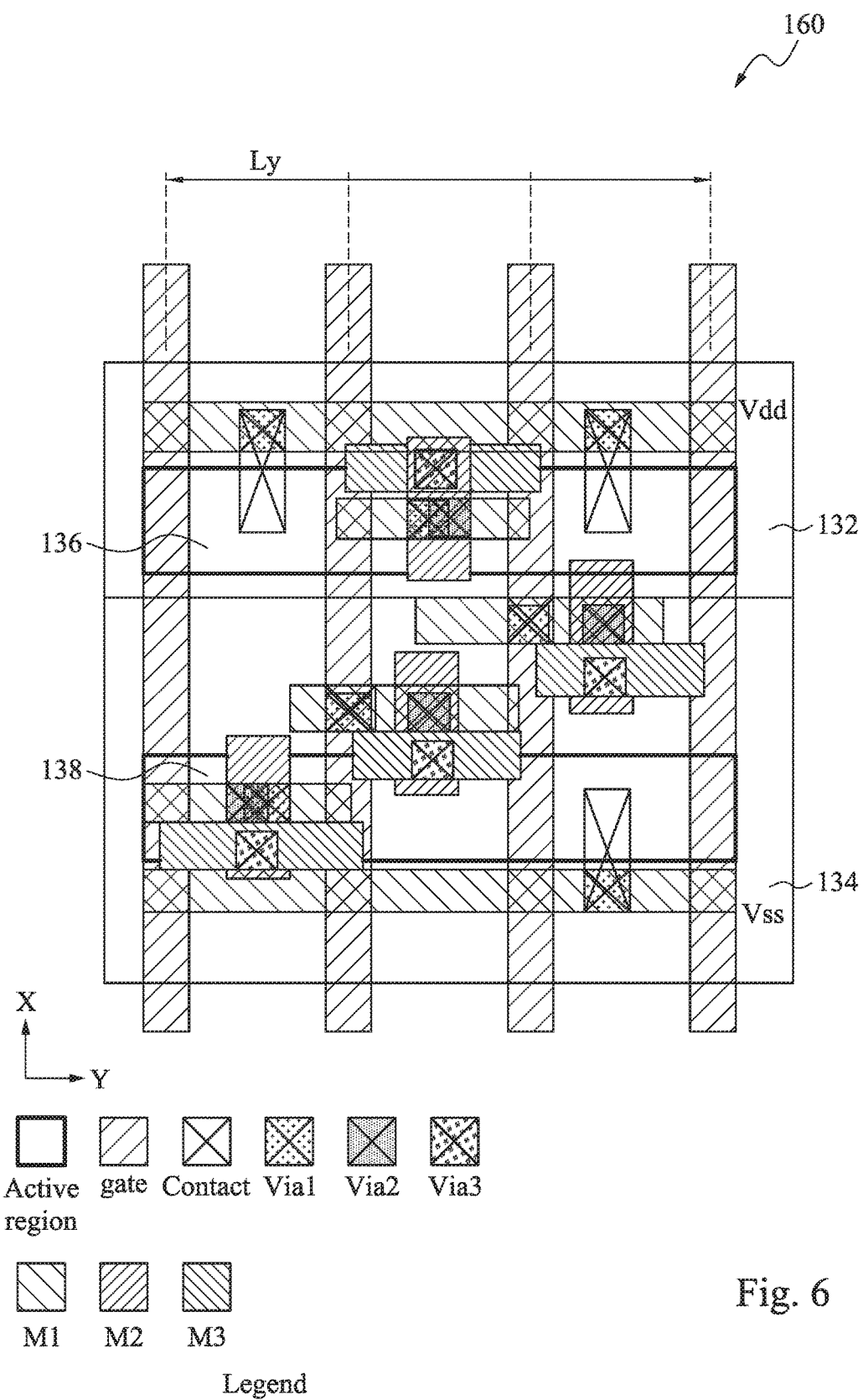
FIG. 6 is a top view of a semiconductor structure having a logic NAND gate cell, in accordance with some embodiments.

FIG. 6 is a top view of a semiconductor structure 160 constructed in accordance with some embodiments. The semiconductor structure 160 includes a logic NAND gate as one example of the semiconductor structure 100, in which the second metal lines M2 have one or more dimensional parameters (thickness, pitch, and width) less than the corresponding ones of the first and third metal lines, as described above.

The semiconductor structure 160 includes an n-type doped well (N-well) 132 and a p-type doped well (P-well) 134. Active regions 136 and 138 are defined by and surrounded by the isolation features (such as STI features). Various transistors, such as pFETs and nFETs, are formed within the N-well 132 and the P-well 134, respectively. In the semiconductor structure 160, the pFETs and the nFETs are configured and connected to form a logic NAND gate. Furthermore, the sources of the pFETs are connected to power line ("Vdd") and the sources of the nFETs are connected to the ground line ("Vss").

The gates have a gate pitch P4 as defined above. In the present embodiment, the pitch P2 of the second metal lines and the gate pitch P4 are configured with a ratio P2:P4 being about 3:2, with a variation less than 20%. In other words, the ratio P2/P4=3/2 (1±20%). In this design, the NAND logic gate in the semiconductor structure 160 spans along the Y direction with a dimension Ly of about 3 gate pitch as 3*P4.

Figure 7:
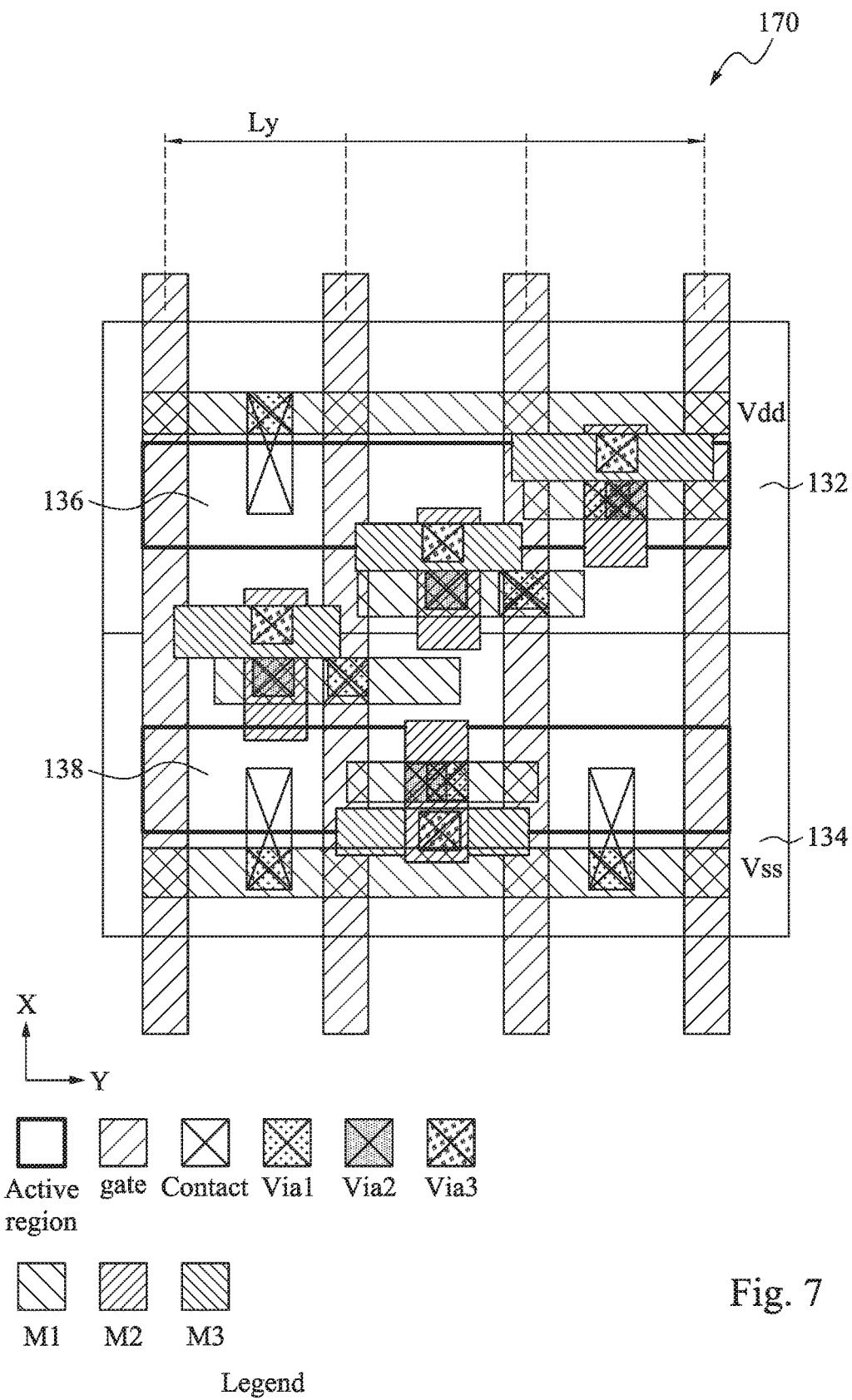
FIG. 7 is a top view of a semiconductor structure having a logic NOR gate cell, in accordance with some embodiments.

FIG. 7 is a top view of a semiconductor structure 170 constructed in accordance with some embodiments. The semiconductor structure 170 includes a logic NOR gate as one example of the semiconductor structure 100, in which the second metal lines M2 have one or more dimensional parameters (thickness, pitch, and width) less than the corresponding ones of the first and third metal lines, as described above.

The semiconductor structure 170 includes an n-type doped well (N-well) 132 and a p-type doped well (P-well) 134. Active regions 136 and 138 are defined by and surrounded by the isolation features (such as STI features). Various transistors, such as pFETs and nFETs, are formed within the N-well 132 and the P-well 134, respectively. In the semiconductor structure 170, the pFETs and the nFETs are configured and connected to form a logic NOR gate. Furthermore, the sources of the pFETs are connected to power line ("Vdd") and the sources of the nFETs are connected to the ground line ("Vss").

The gates have a gate pitch P4 as defined above. In the present embodiment, the pitch P2 of the second metal lines and the gate pitch P4 are configured with a ratio P2:P4 being about 3:2, with a variation less than 20%. In other words, the ratio P2/P4=3/2 (1±20%). In this design, the NOR logic gate in the semiconductor structure 160 spans along the Y direction with a dimension Ly of about 3 gate pitch as 3*P4.

Figure 8:
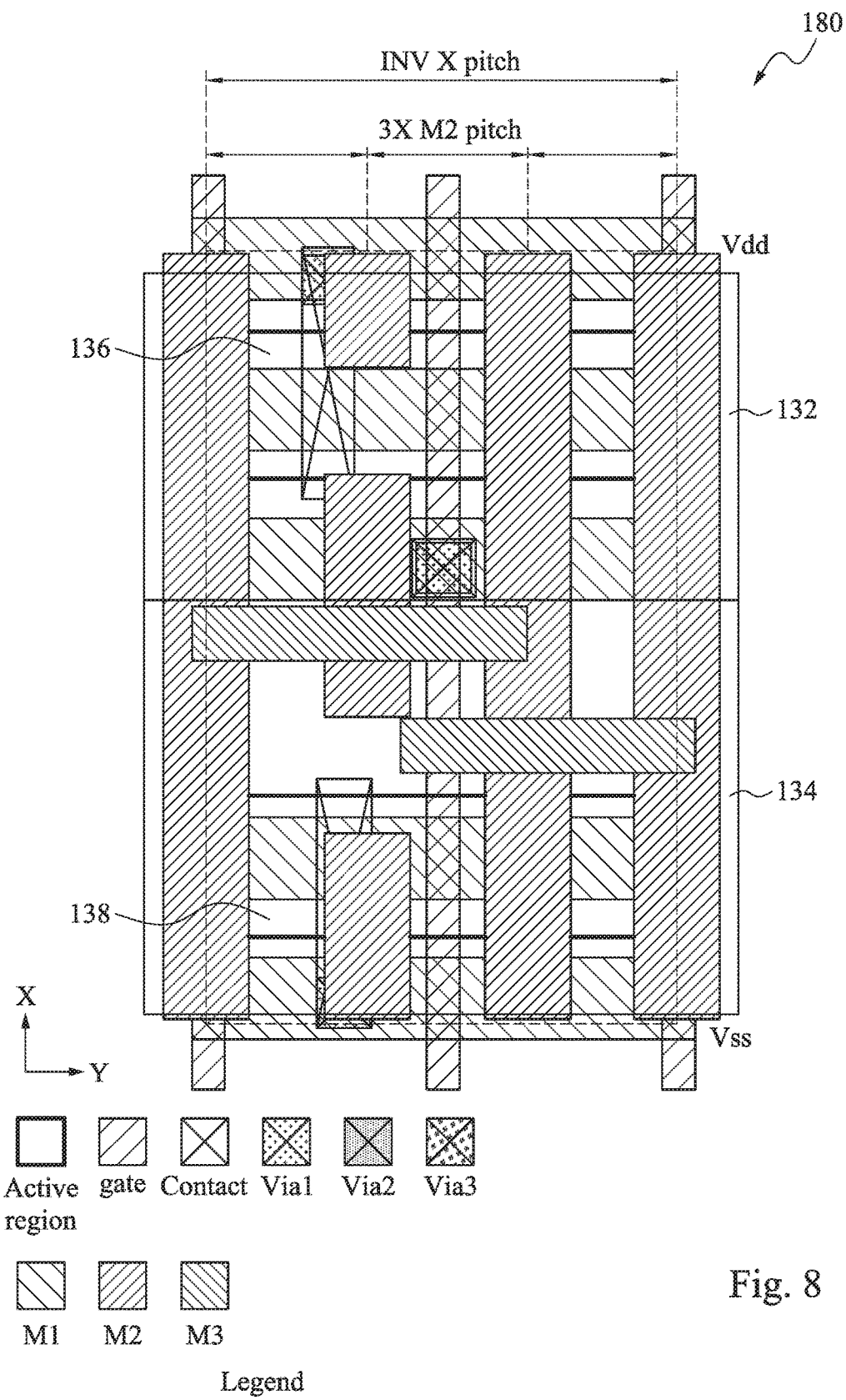
FIG. 8 is a top view of a semiconductor structure having an inverter, in accordance with some embodiments.

FIG. 8 is a top view of a semiconductor structure 180 constructed in accordance with some embodiments. The semiconductor structure 180 includes an inverter as one example of the semiconductor structure 100, in which the second metal lines M2 have one or more dimensional parameters (thickness, pitch, and width) less than the corresponding ones of the first and third metal lines, as described above.

The semiconductor structure 180 includes an n-type doped well (N-well) 132 and a p-type doped well (P-well) 134. A pFET and an nFET are formed within the N-well 132 and the P-well 134, respectively. Active regions 136 and 138 are defined by and surrounded by the isolation features (such as STI features). In the semiconductor structure 180, the pFET and the nFET are coupled together to form a functional inverter. In the present example, the nFET and pFET are configured with corresponding drains connected together (referred to as common drain) and corresponding gates connected together (referred to as common gate). Furthermore, the source of the pFET is connected to power line ("Vdd") and the source of the nFET is connected to the ground line ("Vss"). The common gate and the common drain of the inverter serves as input and output, respectively.

The second metal lines have a pitch P2 less than the corresponding pitches (P1 and P3) of the first and third metal lines. In the present embodiment, the inverter in the semiconductor structure 180 spans along the Y direction with a dimension Ly of about 3 times P2 as 3*P2. In the present embodiment, the pitch P2 of the second metal lines is less than the pitch P4 of the gate 106.

Figure 9:
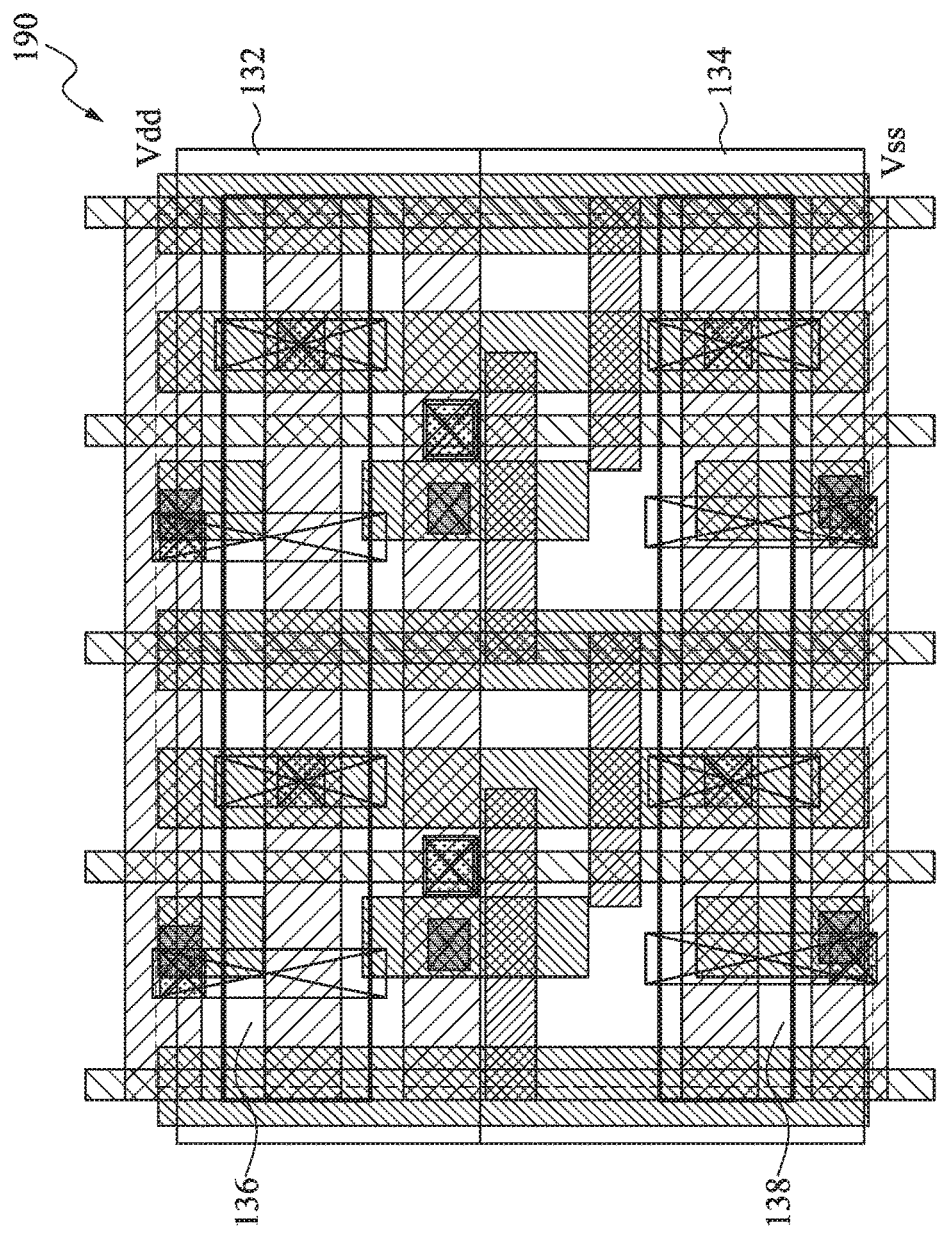
FIG. 9 is a top view of a semiconductor structure having two inverters sharing continuous active regions, in accordance with some embodiments.

FIG. 9 is a top view of a semiconductor structure 190 constructed in accordance with some embodiments. The semiconductor structure 190 includes two inverter configured adjacent (horizontal abutment) and formed in active regions that extend continuously through the inverter cells. The second metal lines M2 have one or more dimensional parameters (thickness, pitch, and width) less than the corresponding ones of the first and third metal lines, as described above.

The semiconductor structure 190 includes an n-type doped well (N-well) 132 and a p-type doped well (P-well) 134. A pFET and an nFET are formed within the N-well 132 and the P-well 134, respectively. Active regions 136 and 138 are defined by and surrounded by the isolation features (such as STI features). Particularly, the active regions (136 and 138) continuously extend along the Y direction such that the two inverters share those continuous active regions. In the semiconductor structure 190, the pFET and the nFET are coupled together to form a functional inverter. In the present example, the nFET and pFET are configured with corresponding drains connected together (referred to as common drain) and corresponding gates connected together (referred to as common gate). Furthermore, the source of the pFET is connected to power line ("Vdd") and the source of the nFET is connected to the ground line ("Vss"). The common gate and the common drain of the inverter serves as input and output, respectively.

The second metal lines have a pitch P2 less than the corresponding pitches (P1 and P3) of the first and third metal lines. In the present embodiment, the inverter in the semiconductor structure 190 spans along the Y direction with a dimension Ly of about 3 times P2 as 3*P3.

Figure 10:
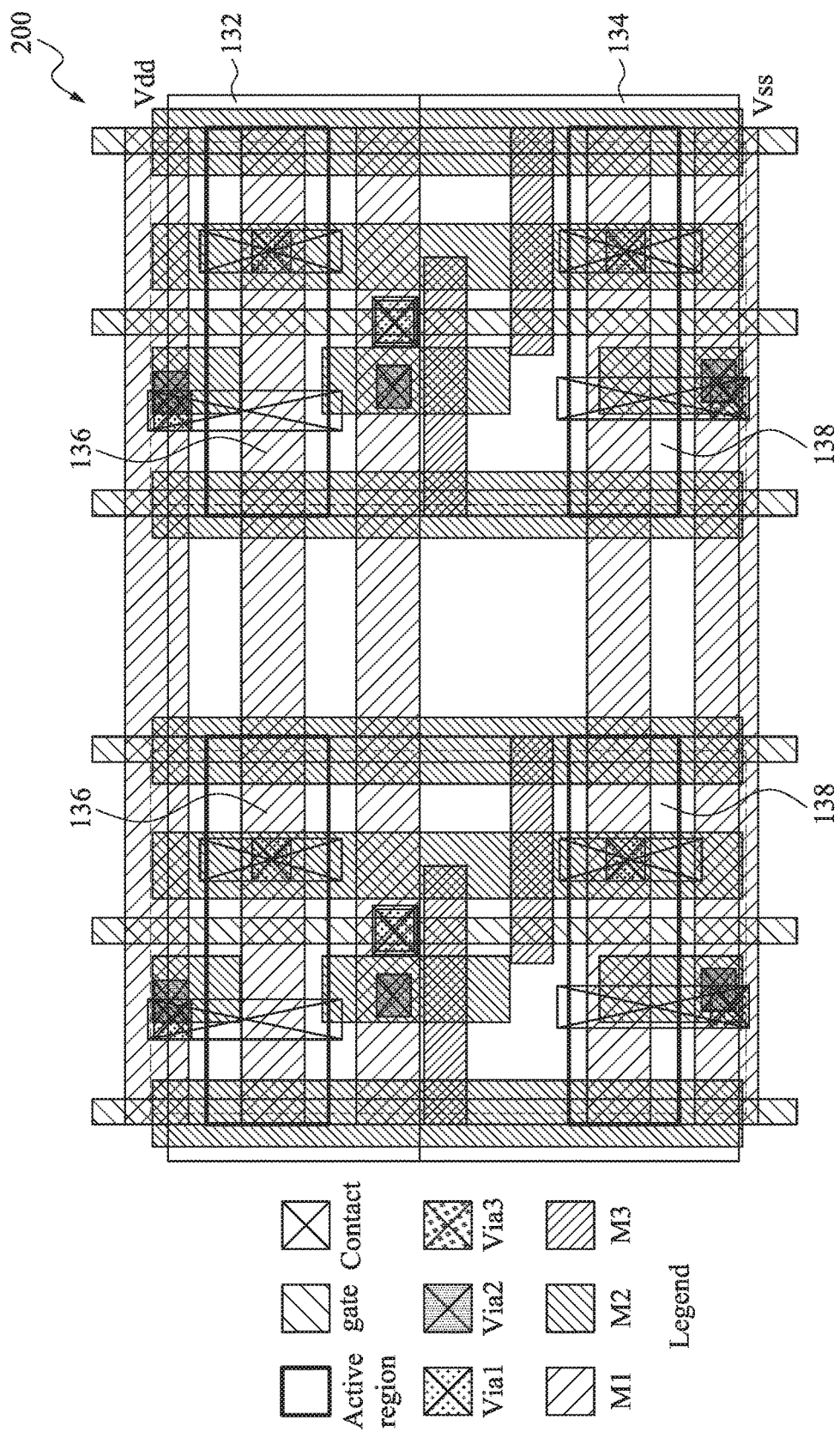
FIG. 10 is a top view of a semiconductor structure having two inverters with separate active regions, in accordance with some embodiments.

FIG. 10 is a top view of a semiconductor structure 200 constructed in accordance with some embodiments. The semiconductor structure 200 includes two inverter configured adjacent (horizontal abutment) and formed in respective active regions. The second metal lines M2 have one or more dimensional parameters (thickness, pitch, and width) less than the corresponding ones of the first and third metal lines, as described above.

The semiconductor structure 200 includes an n-type doped well (N-well) 132 and a p-type doped well (P-well) 134. A pFET and an nFET are formed within the N-well 132 and the P-well 134, respectively. Active regions 136 and 138 are defined by and surrounded by the isolation features (such as STI features). Particularly, the active regions (136 and 138) are discontinuous and each inverter has dedicated active regions, which are separated from the active regions associated with the second inverter. In the semiconductor structure 200, the pFET and the nFET are coupled together to form a functional inverter. In the present example, the nFET and pFET are configured with corresponding drains connected together (referred to as common drain) and corresponding gates connected together (referred to as common gate). Furthermore, the source of the pFET is connected to power line ("Vdd") and the source of the nFET is connected to the ground line ("Vss"). The common gate and the common drain of the inverter serves as input and output, respectively.

The second metal lines have a pitch P2 less than the corresponding pitches (P1 and P3) of the first and third metal lines. In the present embodiment, the inverter in the semiconductor structure 200 spans along the Y direction with a dimension Ly of about 3 times P2 as 3*P3.

Figure 11:
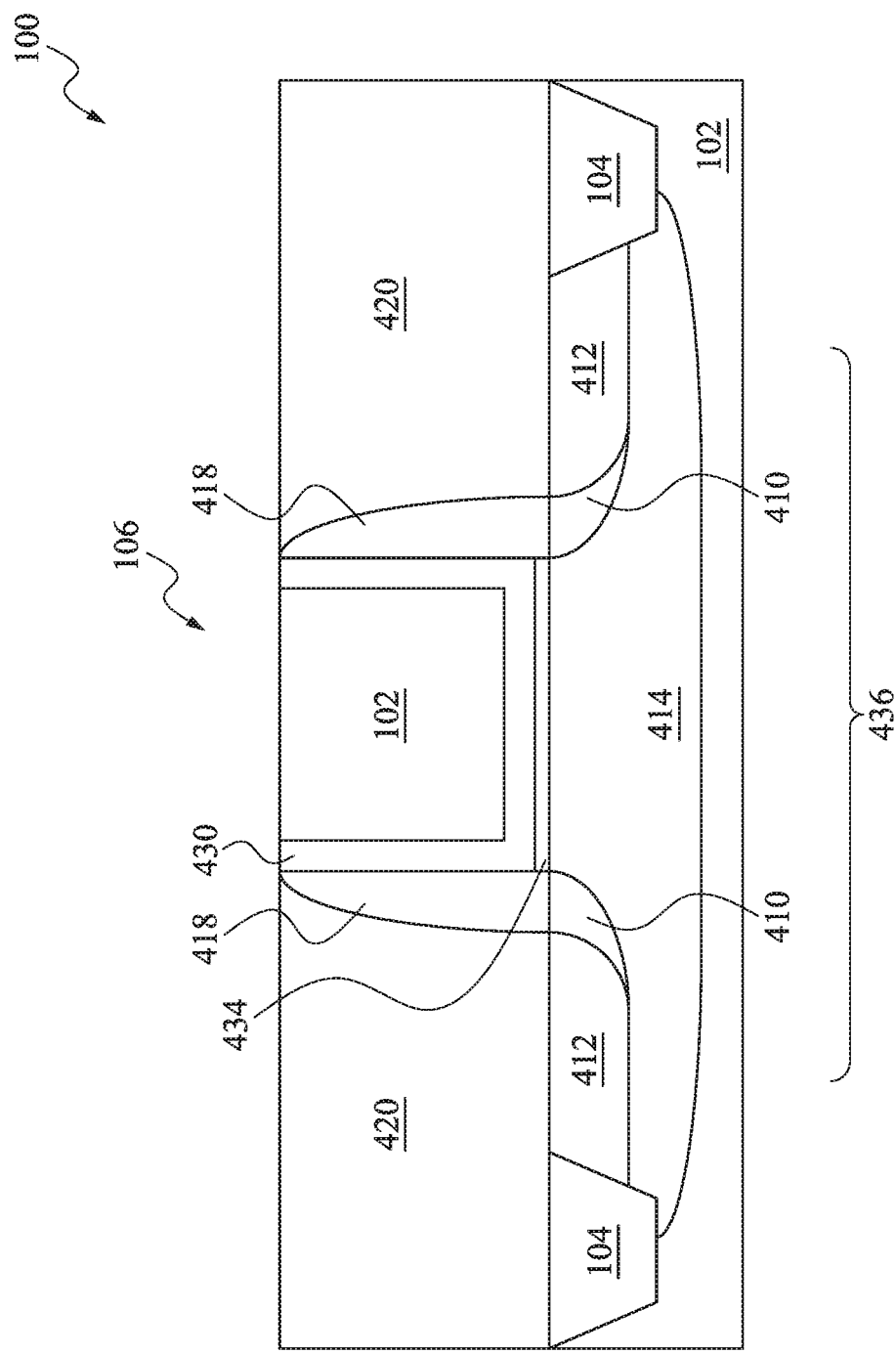
FIG. 11 is a sectional view of the semiconductor structure of FIG. 1, in portion, constructed in accordance with some embodiments.

As noted before, the gate structure 106 in the semiconductor structure 100 may be formed by a gate-replacement procedure. The gate structure 106 and the gate-replacement procedure are further described below with reference to FIG. 11. FIG. 11 is a sectional view of the semiconductor structure 100, in portion, constructed in accordance with some embodiments.

First, one or more dummy gate stack is formed on the semiconductor substrate 102. The dummy gate stack includes a gate dielectric layer and a gate conductive layer on the gate dielectric layer. The formation of the dummy gate stack includes deposition and patterning. The patterning further includes lithography process and etching. A hard mask layer may be further used to pattern the dummy gate stack. In some examples, the gate dielectric layer of the dummy gate stack includes a high k dielectric material layer formed on the semiconductor substrate 102. A capping layer may be formed on the gate dielectric layer. A polysilicon layer as the gate conductive layer is formed on the capping layer. The gate dielectric layer may further include an interfacial layer (IL) interposed between the semiconductor substrate 102 and the high k dielectric material layer. In various examples, the interfacial layer may include silicon oxide formed by a proper technique, such as an atomic layer deposition (ALD), thermal oxidation or UV-Ozone Oxidation. The interfacial layer may have a thickness less than 10 angstrom. The high-k dielectric layer may include metal nitrides or other metal oxides (such as HfO2) and may be formed by a suitable process such as ALD.

The dummy gate material layers are further patterned to form the dummy gate stack by lithography patterning process and etching. A hard mask may be further implemented to pattern the dummy gate material layers. In this case, the hard mask is formed on the dummy gate material layers by deposition and pattering; and one or more etching process is applied to the gate material layers through the openings of the hard mask. The etching process may include dry etching, wet etching or a combination thereof.

Source and drain in the substrate 102. In some embodiments, the source and drain may further include light doped drain (LDD) features 410 formed on the substrate 102 and heavily doped source and drain (S/D) features 412 (with the same type conductivity and a doping concentration greater than that of the LDD features), collectively referred to as source and drain. The LDD features 410 and S/D 412 are formed by respectively ion implantation. One or more thermal annealing process is followed to activate the doped species. In some examples, the source and drain are formed in a doped well 414 (such as an n-type doped well for a PMOS or a p-type doped well for an NMOS). In one example, a gate spacer 418 may be formed on the sidewall of the dummy gate stack. The S/D features 412 are formed on the substrate 102 afterward and are offset from LDD 410 by the gate spacers 418.

The gate spacer 418 includes one or more dielectric material, such as silicon oxide, silicon nitride, silicon oxynitride or combinations thereof. In one embodiment, the gate spacer 418 includes a seal spacer disposed on the sidewall of the gate stack and a main spacer disposed on the seal spacer, which are formed respectively by a procedure including deposition and etch.

In some examples, the source and drain include doping species introduced to the semiconductor substrate 102 by a proper technique, such as ion implantation. In some examples, the source and drain are formed by epitaxy growth to enhance device performance, such as for strain effect to enhance mobility. In furtherance of the embodiments, the formation of the source and drain includes selectively etching the substrate 102 to form the recesses; and epitaxy growing a semiconductor material in the recesses to form the S/D features 412. The recesses may be formed using wet and/or dry etch process to selectively etch the material of the substrate 102, with proper etchant(s), such as carbon tetrafluoride (CF4), tetramethylammonium hydroxide (THMA), other suitable etchant, or a combination thereof. Thereafter, the recesses are filled with a semiconductor material by epitaxially growing S/D features 412 in crystalline structure. The epitaxy growth may include in-situ doping to form S/D with proper dopant. In yet another embodiment, silicide features may be further formed on the source and drain regions to reduce the contact resistance. The silicide features may be formed by a technique referred to as self-aligned silicide (salicide) including metal deposition (such as nickel deposition) onto a silicon substrate, a thermal anneal to react the metal with silicon to form silicide, and an etch to removed un-reacted metal.

An interlayer dielectric (ILD) 420 is formed on the substrate and the dummy gate stack. The ILD 420 is deposited by a proper technique, such as CVD. The ILD 420 includes a dielectric material, such as silicon oxide, low k dielectric material or a combination. Then a chemical mechanical polishing (CMP) process may be applied thereafter to polarize the surface of the ILD 420. In one example, the dummy gate stack is exposed by the CMP process for the subsequent processing steps.

The dummy gate stack is completely or partially removed, resulting in a gate trench in the ILD 420. The removal of the dummy gate stack includes one or more etching steps to selectively remove various gate material layers of the dummy gate stack using a suitable etching process, such as one or more wet etch, dry etch or a combination thereof.

Thereafter, various gate material layers are filled in the gate trench, forming a metal gate 106 in the gate trench. In some embodiments such as in high-k last process, the gate material layers includes a gate dielectric layer 430 and a gate conductive layer (or gate electrode) 432. The gate dielectric layer 430 includes a high-k dielectric material. The gate conductive layer 432 includes metal. In some embodiments, the gate conductive layer 452 include multiple layers, such as a capping layer, a work function metal layer, a blocking layer and a filling metal layer (such as aluminum or tungsten). The gate material layers may further include an interfacial layer 434, such as silicon oxide, interposed between the substrate 102 and the high-k dielectric material. The interfacial layer 434 is a portion of the gate dielectric layer. The various gate material layers are filled in the gate trench by deposition, such as CVD, PVD, plating, ALD or other suitable techniques. The high-k dielectric layer 430 includes a dielectric material having the dielectric constant higher than that of thermal silicon oxide, about 3.9. The high k dielectric layer 430 is formed by a suitable process such as ALD. Other methods to form the high k dielectric material layer include MOCVD, PVD, UV-Ozone Oxidation or MBE. In one embodiment, the high k dielectric material includes HfO2. Alternatively, the high k dielectric material layer 430 includes metal nitrides, metal silicates or other metal oxides.

An operation may be applied to remove excessive gate materials and planarize the top surface. For example, a CMP process may be applied to remove the excessive gate materials. After the CMP process, the top surface of the semiconductor structure 100 is planarized. In the present example, various features, including gate 106, source and drain (410 and 412) are formed and configured as a field-effect transistor 436.

The gate 106, as described above, may include additional material layers. For example, the gate electrode 432 includes a capping layer, a blocking layer, a work function metal layer, and a filling metal layer. In furtherance of the embodiments, the capping layer includes titanium nitride, tantalum nitride, or other suitable material, formed by a proper deposition technique such as ALD. The blocking layer includes titanium nitride, tantalum nitride, or other suitable material, formed by a proper deposition technique such as ALD. In various embodiments, the filling metal layer includes aluminum, tungsten or other suitable metal. The filling metal layer is deposited by a suitable technique, such as PVD or plating. The work functional metal layer includes a conductive layer of metal or metal alloy with proper work function such that the corresponding FET is enhanced for its device performance. The work function (WF) metal layer is different for a pFET and a nFET, respectively referred to as an n-type WF metal and a p-type WF metal. The choice of the WF metal depends on the FET to be formed on the active region. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

Even though only one gate stack 106 is shown in the figures, however, multiple gate stacks are formed on the substrate 102 for various corresponding nFETs, pFETs and other circuit devices. In some embodiments, the gate stack 106 is formed on the 3D fin active region and is a portion of a FinFET.

The present disclosure provides various embodiments of a logic circuit and a layout with multiple metal layers, wherein one or more of the dimensional parameters (thickness, pitch and width) of the second metal lines are less than the corresponding dimensional parameters of the first and third metal lines. Various advantages may present in various embodiments. By utilizing the disclosed metal configuration layout, the logic circuit has a high packing density. In one example, an inverter has a dimension of 2*P4 along the direction parallel with the first metal lines. In another example, a logic NAND gate spans a dimension of 3*P4 along the direction parallel with the first metal lines. In yet another example, a logic NOR gate spans a dimension of 3*P4 along the direction parallel with the first metal lines.

Thus, the present disclosure provides a semiconductor structure in accordance with some embodiments. The semiconductor structure includes a semiconductor substrate; a plurality of field-effect devices disposed on the semiconductor substrate, wherein the field-effect devices include gates with elongated shape oriented in a first direction; a first metal layer disposed over the gates, wherein the first metal layer includes a plurality of first metal lines oriented in a second direction perpendicular to the first direction; a second metal layer disposed over the first metal layer, wherein the second metal layer includes a plurality of second metal lines oriented in the first direction; and a third metal layer disposed over the second metal layer, wherein the third metal layer includes a plurality of third metal lines oriented in the second direction. The first metal lines have a first thickness, the second metal lines have a second thickness, the third metal lines have a third thickness, and wherein the second thickness is less than the first thickness and the third thickness.

The present disclosure also provides a semiconductor structure in accordance with some embodiments. The semiconductor structure includes a semiconductor substrate; a plurality of gates disposed on the semiconductor substrate and oriented in a first direction; a first metal layer disposed over the gates, wherein the first metal layer includes a plurality of first metal lines oriented in a second direction perpendicular to the first direction; a second metal layer disposed over the first metal layer, wherein the second metal layer includes a plurality of second metal lines oriented in the first direction; and a third metal layer disposed over the second metal layer, wherein the third metal layer includes a plurality of third metal lines oriented in the second direction. The first metal lines have a first pitch, a first width and a first thickness; the second metal lines have a second pitch, a second width and a second thickness, the third metal lines have a third pitch, a third width and a third thickness, wherein the at least one parameter of the second pitch, the second width and the second thickness is less than corresponding ones of the first metal lines and the third metal lines.

The present disclosure provides a semiconductor structure in accordance with some embodiments. The semiconductor structure includes a plurality of field-effect transistors (FETs) disposed on a semiconductor substrate, wherein the FETs include gates each having an elongated shape and being oriented in a first direction, wherein the FETs are configured and connected to form a logic gate cell; a first metal layer disposed over the gates, wherein the first metal layer includes a plurality of first metal lines oriented in a second direction different from the first direction; a second metal layer disposed over the first metal layer, wherein the second metal layer includes a plurality of second metal lines oriented in the first direction; and a third metal layer disposed over the second metal layer, wherein the third metal layer includes a plurality of third metal lines oriented in the second direction. The first metal lines have a first pitch $P_1$, the second metal lines have a second pitch $P_2$, the third metal lines have a third pitch $P_3$, and the second pitch is less than the first pitch and the third pitch.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure:
a semiconductor substrate;
a plurality of field-effect devices disposed on the semiconductor substrate, wherein the field-effect devices include gates with elongated shape oriented in a first direction;
a first metal layer disposed over the gates, wherein the first metal layer includes a plurality of first metal lines oriented in a second direction perpendicular to the first direction;
a second metal layer disposed over the first metal layer, wherein the second metal layer includes a plurality of second metal lines oriented in the first direction; and
a third metal layer disposed over the second metal layer, wherein the third metal layer includes a plurality of third metal lines oriented in the second direction,
wherein the first metal lines have a first thickness, the second metal lines have a second thickness, the third metal lines have a third thickness, and wherein the second thickness is less than the first thickness and the third thickness.

2. The semiconductor structure of claim 1, wherein the first metal lines have a first width;
the second metal lines have a second width;
the third metal lines have a third width; and
the second width is less than the first width and the third width.

3. The semiconductor structure of claim 1, wherein the first thickness and the third thickness are substantially equal to each other.

4. The semiconductor structure of claim 1, wherein
the first metal lines have a first pitch $P_1$;
the second metal lines have a second pitch $P_2$;
the third metal lines have a third pitch $P_3$; and
the second pitch is less than the first pitch and the third pitch.

5. The semiconductor structure of claim 4, wherein the gates have a fourth pitch $P_4$, wherein a ratio of the second pitch over the fourth pitch $P_2:P_4$ is about 3:2.

6. The semiconductor structure of claim 5, wherein the plurality of field-effect devices includes an n-type conductivity field-effect transistor (nFET) and a p-type conductivity field-effect transistor (pFET) coupled together to form an inverter, wherein the inverter spans a dimension of about $2*P_4$ along the second direction.

7. The semiconductor structure of claim 5, further comprising an NAND gate spanning a dimension of about $3*P_4$ along the second direction, wherein the NAND gate includes a field-effect transistor (FET).

8. The semiconductor structure of claim 5, further comprising an NOR gate spanning a dimension of about $3*P_4$ along the second direction.

9. A semiconductor structure:
a semiconductor substrate;
a plurality of gates disposed on the semiconductor substrate and oriented in a first direction;
a first metal layer disposed over the gates, wherein the first metal layer includes a plurality of first metal lines oriented in a second direction perpendicular to the first direction;
a second metal layer disposed over the first metal layer, wherein the second metal layer includes a plurality of second metal lines oriented in the first direction; and
a third metal layer disposed over the second metal layer, wherein the third metal layer includes a plurality of third metal lines oriented in the second direction,
wherein the first metal lines have a first pitch $P_1$, a first width and a first thickness; the second metal lines have a second pitch $P_2$, a second width and a second thickness, the third metal lines have a third pitch $P_3$, a third width and a third thickness, wherein at least one parameter of the second pitch, the second width and the second thickness is less than corresponding ones of the first metal lines and the third metal lines.

10. The semiconductor structure of claim 9, wherein
the second width is less than the first width and the third width; and
the first width and the third width are substantially equal to each other.

11. The semiconductor structure of claim 10, wherein the second thickness is less than the first thickness and the third thickness.

12. The semiconductor structure of claim 11, wherein the second pitch is less than the first pitch and the third pitch.

13. The semiconductor structure of claim 12, wherein the gates have a fourth pitch $P_4$, wherein a ratio of the second pitch over the fourth pitch $P_2:P_4$ is about 3:2.

14. The semiconductor structure of claim 13, further comprising an inverter formed on the plurality of gates, wherein the inverter further include an n-type conductivity field-effect transistor (nFET) and a p-type conductivity field-effect transistor (pFET) coupled together through a common drain, wherein the inverter spans a dimension of about $3*P_2$ along the second direction.

15. The semiconductor structure of claim 13, further comprising an NAND gate and a NOR gate, each spanning a dimension of about $3*P_4$ along the second direction, wherein each of the NAND gate and NOR gate includes field-effect transistors (FETs) configured to function as a corresponding logic gate.

16. A semiconductor structure, comprising:
   a plurality of field-effect transistors (FETs) disposed on a semiconductor substrate, wherein the FETs include gates each having an elongated shape and being oriented in a first direction, wherein the FETs are configured and connected to form a logic gate cell;
   a first metal layer disposed over the gates, wherein the first metal layer includes a plurality of first metal lines oriented in a second direction different from the first direction;
   a second metal layer disposed over the first metal layer, wherein the second metal layer includes a plurality of second metal lines oriented in the first direction; and
   a third metal layer disposed over the second metal layer, wherein the third metal layer includes a plurality of third metal lines oriented in the second direction,
   wherein the first metal lines have a first pitch $P_1$, the second metal lines have a second pitch $P_2$, the third metal lines have a third pitch $P_3$, and the second pitch is less than the first pitch and the third pitch.

17. The semiconductor structure of claim 16, wherein the gates have a fourth pitch $P_4$, wherein a ratio of the second pitch over the fourth pitch $P_2:P_4$ is about 2:3.

18. The semiconductor structure of claim 17, wherein the plurality of FETs are configured to form an NAND gate spanning a dimension of about $3*P_4$ along the second direction.

19. The semiconductor structure of claim 17, wherein the plurality of FETs are configured to form a NOR gate spanning a dimension of about $3*P_4$ along the second direction.

20. The semiconductor structure of claim 16, wherein
   the first metal lines have a first width;
   the second metal lines have a second width;
   the third metal lines have a third width; and
   the second width is less than the first width and the third width.

* * * * *